United States Patent [19]

Berkman et al.

[11] 3,845,738

[45] Nov. 5, 1974

[54] VAPOR DEPOSITION APPARATUS WITH PYROLYTIC GRAPHITE HEAT SHIELD

[75] Inventors: Samuel Berkman, Florham Park; Ural Roundtree, Jr., Westfield, both of N.J.

[73] Assignee: RCA Corporation, New York, N.Y.

[22] Filed: Sept. 12, 1973

[21] Appl. No.: 396,564

[52] U.S. Cl. .................... 118/49, 219/10.49

[51] Int. Cl. .................... C23c 13/08

[58] Field of Search .................... 118/48–49.5, 118/620; 219/10.49; 117/106–107.2; 148/174, 175

[56] References Cited

UNITED STATES PATENTS

| | | | |
|---|---|---|---|
| 3,213,177 | 10/1965 | Diefendorf | 13/20 X |
| 3,288,629 | 11/1966 | McCreight | 117/106 R |
| 3,549,847 | 12/1970 | Clark et al. | 219/10.49 |
| 3,574,006 | 4/1971 | Dersin et al. | 148/175 X |
| 3,593,775 | 7/1971 | Privott, Jr. et al. | 219/10.49 X |
| 3,633,537 | 1/1972 | Howe | 118/48 |

*Primary Examiner*—Morris Kaplan
*Attorney, Agent, or Firm*—Arthur I. Spechler

[57] ABSTRACT

A heat shield of pyrolytic graphite is deposited around the peripheries of silicon wafers in chemical-vapor-deposition apparatus of the type wherein the wafers are heated and epitaxial layers of silicon are deposited upon the surfaces of the heated wafers. The wafers and the heat shield are disposed on a susceptor of conventional graphite. The heat shield has a C-axis along which heat conductivity is relatively much lower than in the wafers and in the susceptor, and the C-axis is disposed perpendicularly to the susceptor, whereby most of the silicon is deposited onto the wafers.

3 Claims, 3 Drawing Figures

VAPOR DEPOSITION APPARATUS WITH PYROLYTIC GRAPHITE HEAT SHIELD

This invention relates to apparatus for producing semiconductor devices. More particularly, the invention relates to apparatus for depositing a layer of a substance on the surface of a substrate by a chemical-vapor-deposition process wherein the deposition of the substance is temperature dependent. The novel apparatus and method are particularly useful for depositing an epitaxial layer of silicon on a wafer of silicon in the manufacture of semiconductor devices, such as integrated circuits, for example.

In the production of certain semiconductor devices, an epitaxial layer of silicon on a silicon wafer is used as a starting material. The epitaxial layer of silicon is deposited upon the wafer in a chemical-vapor-deposition process wherein the wafer is heated and the silicon layer is deposited epitaxially from the vapor of a chemical reaction. In this process it is desirable that all surfaces, except those of the silicon wafers, be relatively cold because the deposition of silicon from the vapor state, as from the reaction of silicon tetrachloride and hydrogen, for example, on a hot surface is temperature dependent.

In reactor furnaces, wherein silicon wafers are disposed upon susceptors of conventional graphite and the susceptors are heated by rf energy, silicon from the vapor state is not only deposited on the wafers but also on the susceptors. After a number of depositions of silicon layers on the susceptors, the susceptors have to be etched to remove the silicon deposited on them. This procedure, besides being a time consuming one, reduces the life of the susceptor. Also, the silicon deposited upon the wafers in this process tends to form crowns, that is, a thickening of the deposited layers of silicon around the peripheries of the wafers, and these crowns have to be removed, usually by grinding before the wafers can be processed further.

In accordance with the present novel apparatus and method, means are provided to cause a substance, deposited from the vapor state in a temperature-dependent process, to be deposited in greater quantities upon relatively hotter materials than upon cooler ones.

Briefty stated, in apparatus of the type wherein a substrate is heated in a chamber and a substance is deposited onto a surface of the substrate from a vapor, the novel apparatus comprises a heat shield that surrounds the periphery of the substrate. The heat shield, properly oriented, has a lower heat conductivity than that of the substrate so that it is not heated to a temperature as high as that of the substrate, whereby less of the substance is deposited on the heat shield than on the substrate.

In a preferred embodiment of the novel apparatus, the heat shield comprises a sheet of pyrolytic graphite, formed with at least one through opening therein, and adapted to be disposed against a susceptor of conventional graphite. The substrate to be coated with a substance, by deposition from a vapor, is disposed on or against the susceptor and within the through opening of the heat shield. The sheet of pyrolytic graphite has a C-axis along which direction heat conduction is relatively much less than along other axes of the heat shield, and the heat shield is disposed with its C-axis transversely, and preferably substantially perpendicularly, to both the susceptor and to the substrate.

Figure 1:
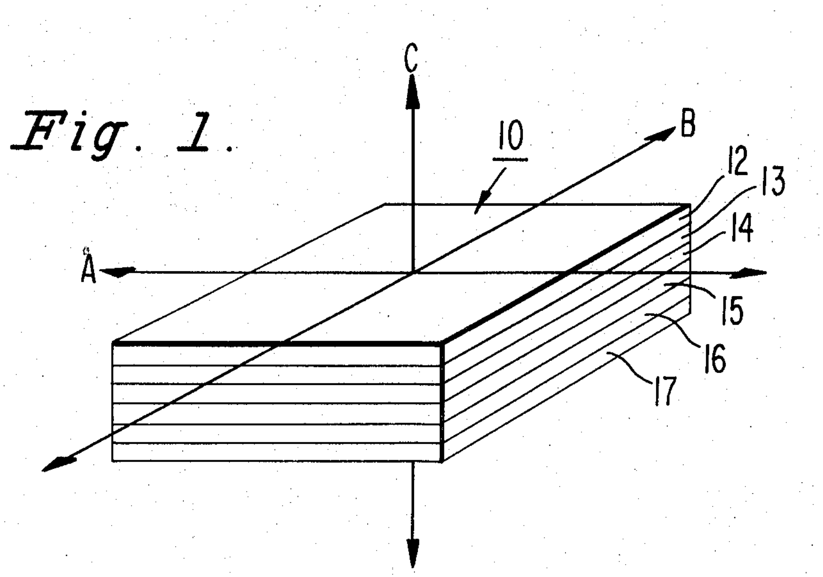
FIG. 1 is a perspective drawing of a sheet of pyrolytic graphite of the type used as a heat shield in the novel apparatus, showing heat conduction axes thereof.

Referring now to FIG. 1 of the drawing, there is shown a sheet 10 of pyrolytic graphite of the type used for the novel heat shields of the present invention. Pyrolytic graphite is a polycrystalline form of carbon with a well oriented structure. It is formed by the carbon deposition on a surface by the decomposition of a carbonaceous gas, e.g., methane, in a process that is carried out at very high temperatures (usually above 2,200°C). The resulting material, pyrolytic graphite, deposited in basal planes designated 12–17, contains no binder, has high purity and a density that normally exceeds 99.5 percent of the theoretical density of conventional graphite.

Pyrolytic graphite behaves like a metal in its basal planes 12–17 (parallel to the surface of deposition), but is like a ceramic material across these basal planes 12–17. The basal planes 12–17 consist of strongly bonded atoms within each plane, but adjacent basal planes are held together by only weak bonding forces between the planes. The thermal and electric coductivities in the basal planes are 100 to 1,000 times greater than those across these planes. The properties of the sheet 10 of pyrolytic graphite exhibit marked directionality and it is, therefore, necessary to specify the direction of measurement for each characteristic.

The sheet 10 has three directional axes. An A-axis and a B-axis of the sheet 10 are parallel to the surface of deposition of the basal planes 12–17 and perpendicular to each other. A C-axis of the sheet 10 is perpendicular to both the A-axis and the B-axis and to the basal planes 12–17.

The thermal properties of pyrolytic graphite are strongly affected by its structural anisotropy. Pyrolytic graphite acts as an excellent heat insulator in the C-axis direction and as a very good heat conductor in the plane containing the A and B axes (directions). The thermal conductivity of pyrolytic graphite is about equal to that of copper at room temperature, but because it is highly anisotropic, the ratio of the thermal conductivity in the A and B axes directions to that in the C-axis direction is about 200 to 1.

Pyrolytic graphite has a sublimation point of 3,649°C, a latent heat of sublimation of 25,700 BTU/lb; and a boiling point of 4,200°C.

Pyrolytic graphite differs from conventional graphite. Pyrolytic graphite sheets are grown leaving no voids. Conventional graphite, on the other hand, is made by the agglomeration and compaction of discrete particles. In making conventional graphite, crushed coke mixed with pitch as a binder is extruded or molded to shape and then baked. Since the binder decomposes as the volatiles escape, the material formed is relatively porous. The carbon produced at this stage in this process is baked again at higher temperatures to form conventional graphite. Susceptors adapted to be heated by rf energy are usually made of conventional graphite, as will hereinafter be described.

Figure 2:
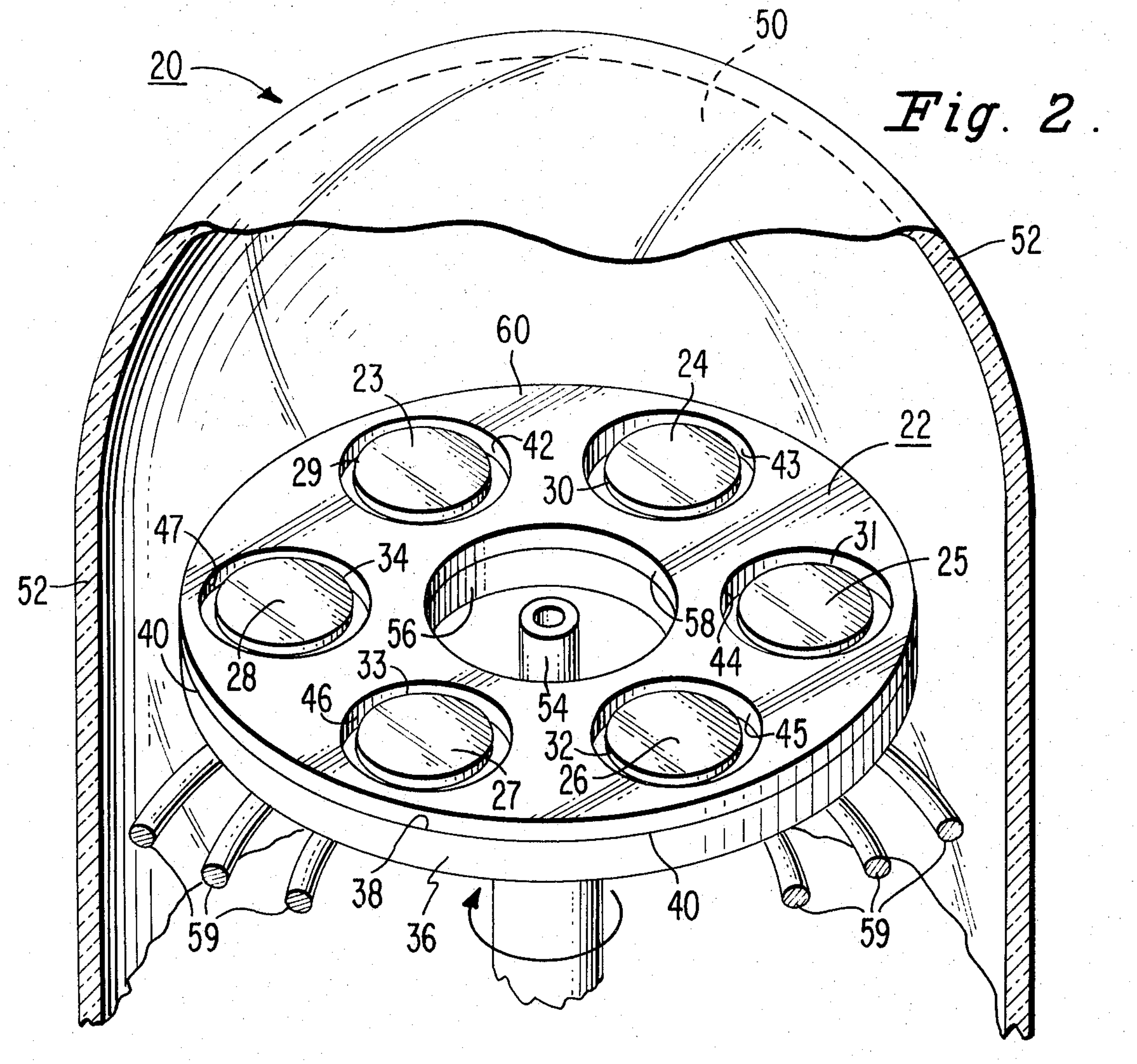
FIG. 2 is a fragmentary perspective drawing of a vertical silicon epitaxial reactor furnace, illustrating one embodiment of the novel heat shield.

Referring now to FIG. 2 of the drawing, there is shown a portion of a standard vertical (pancake) silicon epitaxial reactor furnace 20, employing a novel heat shield 22 of pyrolytic graphite. The reactor furnace 20, in the present embodiment, is used to deposit a layer of silicon epitaxially on the upper surfaces 23–28 of silicon wafers 29–34, respectively, disposed on a susceptor 36 of conventional graphite. The susceptor 36 is in the form of a flat disc upon whose upper surface 38 the lower surface 40 of the heat shield 22 rests. The heat shield 22 can have a thickness of between about 0.15cm and 6.40cm, and the wafers, in the instant example, are between about 0.02cm and 0.1cm in thickness.

The heat shield 22 is formed with a plurality of through openings 42–47, and the silicon wafers 29–34 are disposed within the through openings 42–47, respectively, and in contact with the upper surface 38 of the susceptor 36. Thus, the peripheries of each of the wafers are surrounded by the pyrolytic graphite of the heat shield 22.

The susceptor 36 and the heat shield 22 are disposed within a chamber 50, defined by a bell jar 52, and means are provided to create a vapor within the chamber 50 from which a substance, silicon, for example, can be deposited upon the surfaces 23–28 of the wafers 29–34. To this end, a pipe or tube 54 is disposed beneath the susceptor 36 and adapted to direct chemicals (gases), such as silicon tetrachloride and hydrogen, for example, into the chamber 50 through aligned central openings 56 and 58 in the susceptor 36 and the heat shield 22, respectively, in a manner well known in the semiconductor art.

Rf heating coils 59 are disposed beneath the susceptor 36 to heat the susceptor 36, when suitably energized, whereby to heat the wafers 29–34 in contact with the susceptor 36, in a manner well known in the art. The susceptor 36, with the heat shield 22 and the wafers 29–34 thereon, is adapted to be rotated within the chamber 50 by means (not shown), in a manner well known in the art, to provide for a uniform deposition of silicon on the wafers 29–34.

An important feature of the novel apparatus and method of the present invention is to provide the heat shield 22 so that the direction of its C-axis is transverse, and preferably perpendicular, to the surface 38 of the susceptor 36 and to the upper surfaces 23–28 of the wafers 29–34. When the C-axis is so disposed, the heat shield 22 has a heat conduction along the C-axis of about 40 times less than that of the susceptor 36 of conventional graphite. Therefore, since the susceptor 36 and the silicon wafers 29–34 have better heat conduction than the heat shield 22 along the C-axis, the silicon wafers 29–34 can be heated to a higher temperature than that of the heat shield 22. Under these conditions, substances that are temperature dependent tend to deposit more on the hotter surfaces 23–28 of the wafers 29–34 rather than on the cooler upper surface 60 of the heat shield 22.

In operation of the reactor furnace 20, silicon tetrachloride (or other chloride of silicon, i.e., $SiHCl_3$) and hydrogen gases are introduced into the chamber 50, and the rf coils 59 are energized to heat the susceptor 36. When the temperature of the susceptor 36 reaches about 1,200°C, the silicon wafers 29–34 also reach a temperature of about 1,200°C, but the surface 60 of the heat shield 22 reaches a temperature of only about 1,010°C. The silicon tetrachloride is reduced by the hydrogen, and silicon is deposited, from the chemical vapor state, epitaxially onto the surfaces 23–28 of the wafers 29–34. Relatively little silicon is deposited upon the cooler surface 60 of the heat shield 22 with respect to the amount of silicon deposited epitaxially on the hotter surfaces 23–28 of the wafers 29–34, for the reasons explained supra.

Figure 3:
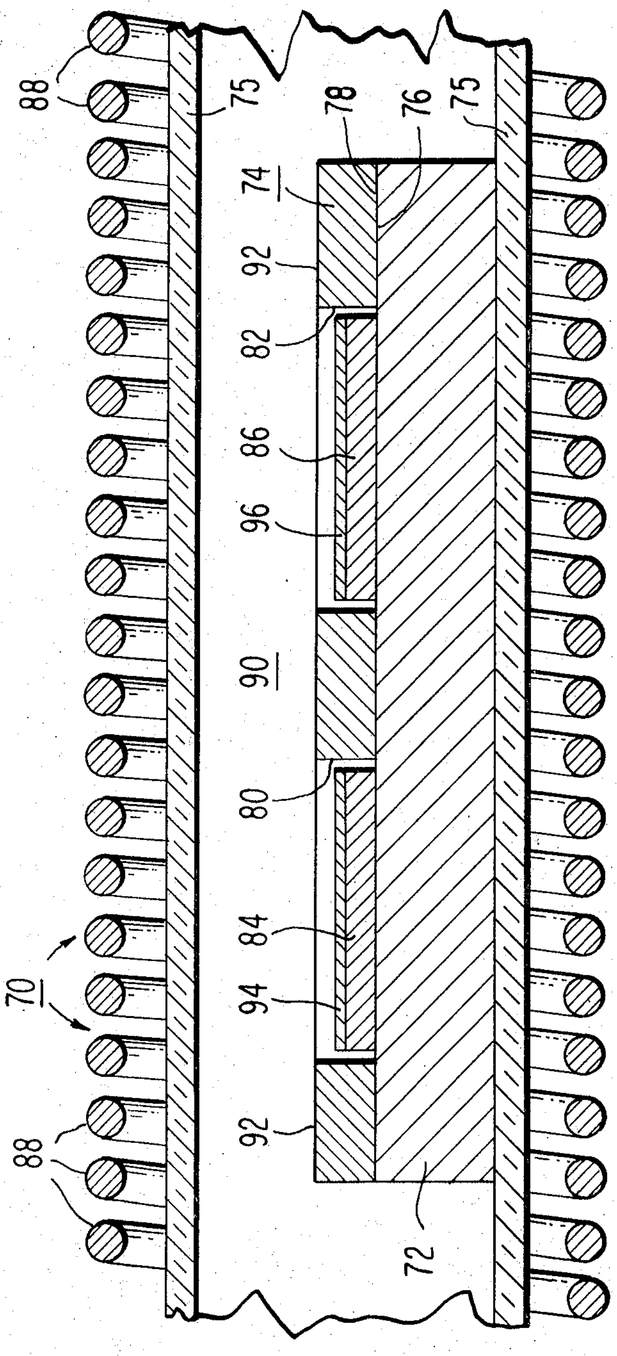
FIG. 3 is a fragmentary schematic drawing of a standard horizontal silicon epitaxial reactor furnace in cross section, illustrating another embodiment of the novel heat shield.

Referring now to FIG. 3 of the drawings, there is shown a standard horizontal epitaxial silicon reactor 70 employing a susceptor 72 of conventional graphite and a heat shield 74 of pyrolytic graphite. The susceptor 72 is disposed within a quartz reactor tube 75, and the lower surface 76 of the heat shield 74 is disposed on the upper surface 78 of the susceptor 72. The heat shield 74, in the instant embodiment, may have a thickness of between about 0.15cm and 6.40cm and is formed with a plurality of through openings 80 and 82, for example. While only two openings are illustrated in the heat shield 74, it is within the ccontemplation of the present invention for the heat shield 74 to be formed with as many through openings as may be necessary, as determined by the size of the susceptor upon or against which it rests. If the materials to be disposed within the through openings 80 and 82 are relatively thin, the susceptor 72 may comprise raised portions 84 and 86 that extend from its upper surface 78 partially into the through openings. The raised portions 84 and 86 are of conventional graphite and may be integral with, or separate from, the susceptor 72. A plurality of relatively thin substrates, such as wafers 94 and 96 of silicon, for example, are disposed within the through openings 80 and 82, respectively, and rest upon raised portions 84 and 86 of the susceptor 72.

Heat is applied to the susceptor 72 by *rf* heating, provided by rf heating coils 88 when suitably energized. Chemically reacting gases, such as silicon tetrachloride and hydrogen, for example, are introduced into a chamber 90 above the upper surface 92 of the heat shield 74. The chamber 90 is defined by the quartz reactor tube 75.

The operation of the heat shield 74, during the deposition of silicon from the chemical vapor of the heated reacting gases within the chamber 90, is substantially the same as that described for the heat shield 22 within the reactor furnace 20. For example, when the susceptor 72 and its raised portions 84 and 86 are heated to a temperature at which the deposition of silicon is deposited satisfactorily onto the wafers 94 and 96, the temperature of the surface 92 of the heat shield 74 is relatively much lower than that of either the susceptor 72 or the wafers 94 and 96. Hence, relatively little silicon is deposited upon the cooler surface 92 of the heat shield 74 in comparison to the deposition of silicon on the hotter surfaces of the wafers 94 and 96. Under these conditions, most of the deposition of silicon from the vapor state is in the form of epitaxial layers upon the upper surfaces of the wafers 94 and 96.

By employing a heat shield wherein the through openings are just large enough to surround the periphery of each of the wafers, and wherein the outer surface of each wafer is almost coplanar with the outer surface of the heat shield, the epitaxially deposited layers on the wafers have a substantial uniform thickness, that is, they do not exhibit crowns (thickening) adjacent their peripheries.

In the absence of a heat shield in combination with the susceptor and wafers, the temperature-dependent substance deposited by the chemical vapor deposition processes described herein is deposited in substantially equal amounts upon the wafers and upon the susceptor so that the susceptor must be cleaned periodically, resulting in a loss of efficiency in the process, a decrease in productivity, a costly expenditure of time to etch excessive depositions from the susceptor surface, and a decrease in the life of the susceptor itself.

While the novel apparatus and method for directing temperature-dependent depositions from a vapor state primarily onto heated substrates have been described by processes for depositing silicon epitaxially onto silicon substrates, the invention is not limited thereto; and, it is within the contemplation of the present invention to include all temperature-dependent depositions from the vapor state onto relatively hot substrates surrounded by a relatively cooler heat shield.

What is claimed is

1. In apparatus of the type wherein a substrate is heated in a chamber, and wherein a substance is deposited onto a surface of the heated substrate from a vapor, the improvement comprising:
an inducation heater operatively associated with said chamber,
a susceptor, comprising conventional graphite, disposed within said chamber,
said substrate is a wafer of silicon and disposed on said susceptor,
said substance is silicon epitaxially deposited on said surface, and said heat shield being supported on said susceptor and comprising a planar member of pyrolytic graphite having a C-axis transversely disposed with respect to said surface of said substrate and said shield having an opening there-through within which is disposed said substrate.

2. In apparatus of the type wherein a substrate is heated in a chamber, and wherein a subtance is deposited onto a surface of the heated substrate from a vapor, the improvement comprising:
an inducation heater operatively associated with said chamber,
a susceptor comprising conventional graphite diposed within said chamber,
said substrate is a wafer of silicon,
said substance is the reduction product of the chemical reaction between $SiCl_4$ and $H_2$,
said heat shield being supported on said susceptor and comprising a planar member of pyrolytic graphite having a C-axis along which the heat conductivity is relatively less than in said conventional graphite, and said C-axis is substantially perpendicular to the surface of said susceptor and said shield having an opening there-through within which is disposed said substrate.

3. In apparatus of the type wherein a substrate is heated in a chamber, and wherein a substance is deposited onto a surface of the heated substrate from a vapor, the improvement comprising:
an inducation heater operatively associated with said chamber,
a susceptor comprising conventional graphite disposed within said chamber,
said heat shield comprises a sheet of pyrolytic graphite formed with a plurality of through openings therein and is diposed against said susceptor,
said heat shield has a C-axis along which heat conduction is relatively less than along other axes of said heat shield,
a plurality of substrates, each disposed within a separate one of said through openings, and
said C-axis of said heat shield is disposed transversely to the surface of said susceptor.

* * * * *